United States Patent
Udell et al.

(10) Patent No.: US 12,185,501 B2
(45) Date of Patent: Dec. 31, 2024

(54) REMOTE RADIO UNIT WITH REDUCED VOLUME AND INCREASED THERMAL EFFICIENCY

(71) Applicant: Meta Platforms, Inc., Menlo Park, CA (US)

(72) Inventors: Eric Udell, Cypress, TX (US); Kodanda Ram Reddy Engala, Irving, TX (US); Granthana Kattehalli Rangaswamy, San Jose, CA (US); Imad Shehab, La Jolla, CA (US); Srishti Saraswat, Santa Clara, CA (US); Farbod Tabatabai, San Francisco, CA (US); Joseph David Volz, Pacifica, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 400 days.

(21) Appl. No.: 17/673,261

(22) Filed: Feb. 16, 2022

(65) Prior Publication Data

US 2023/0096962 A1    Mar. 30, 2023

Related U.S. Application Data

(60) Provisional application No. 63/248,296, filed on Sep. 24, 2021.

(51) Int. Cl.
*H05K 7/14* (2006.01)
*H03F 3/24* (2006.01)
(Continued)

(52) U.S. Cl.
CPC ........... *H05K 7/2039* (2013.01); *H03F 3/245* (2013.01); *H04B 1/40* (2013.01); *H03F 2200/451* (2013.01)

(58) Field of Classification Search
CPC .. H05K 7/20; H05K 5/03; H05K 7/14; H05K 13/04; H05K 5/04; H05K 3/32; H05K 7/04; H05K 1/05; H05K 1/16; H05K 1/09; H05K 3/10; H05K 3/38; H05K 7/18; H02B 1/56; H02B 1/48; H02B 1/26; H02B 1/00; H02B 1/048; H02B 13/02; B60H 3/06;
(Continued)

(56) References Cited

U.S. PATENT DOCUMENTS 4,163,274 A * 7/1979 Carolus .................. H05K 9/006
                                                361/736
6,212,404 B1   4/2001 Hershtig
(Continued)

OTHER PUBLICATIONS

International Search report and Written Opinion for International Application No. PCT/US2022/044037, mailed Jan. 4, 2023, 8 pages.

*Primary Examiner* — Tu X Nguyen
(74) *Attorney, Agent, or Firm* — Greenberg Traurig, LLP (57) ABSTRACT

The disclosed device may include a radio frequency (RF) component and a thermal management component establishing a thermal path with the RF component. The device may also include an RF filter electrically that is coupled to the RF component and arranged away from the thermal path. The device may further include a chassis for housing the RF component. The thermal management component and the RF filter may be positioned near an exterior of the chassis. Various other devices, apparatuses, and systems are also disclosed.

20 Claims, 5 Drawing Sheets

(51) Int. Cl.
*H04B 1/40* (2015.01)
*H05K 7/20* (2006.01)
(58) Field of Classification Search
CPC . B60H 1/00; H03H 9/46; H03H 17/06; H01Q 9/04; H01Q 1/12; H04W 88/08; H02G 1/12
See application file for complete search history.

(56) References Cited

U.S. PATENT DOCUMENTS

| | | |
|---|---|---|
| 6,480,706 B1 | 11/2002 | Mimura et al. |
| 2012/0044840 A1 | 2/2012 | Peng et al. |
| 2021/0126351 A1 | 4/2021 | Hou |

* cited by examiner

REMOTE RADIO UNIT WITH REDUCED VOLUME AND INCREASED THERMAL EFFICIENCY

CROSS REFERENCE TO RELATED APPLICATION

This application claims the benefit of U.S. Provisional Application No. 63/248,296, filed 24 Sep. 2021, the disclosure of which is incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Wireless system technologies are increasingly adopting distributed networks utilizing remote radio units ("RRU") that may extend wireless coverage, particularly in challenging environments such as rural areas or tunnels. An RRU may include various baseband components, processors, field-programmable gate arrays ("FPGA") and/or dedicated application-specific integrated circuits ("ASIC") that may perform high computational transactions and signal processing. These baseband components may be connected to radio frequency ("RF") components along with power supplies to power up the entire RRU. Under increased loading conditions, these baseband components and power supplies may experience increased temperatures that may require proper thermal management solutions to dissipate heat and cool down the components. In addition, power amplifiers modules ("PAM"), as part of the RF sections, may generate significant thermal load that may heat up the entire RRU unit. Such thermal load may become problematic to the baseband components, power supplies and/or other components on the board by impacting the performance of the components and reducing the lifetime expectancy of the components. RRUs may be mounted outdoors, including on roof tops and/or on antenna towers, and may be subjected to different environmental conditions, such as increased seasonal temperatures and solar loading conditions that may further heat up the RRUs. RRUs may also have to be Ingress Protection ("IP") rated to protect the components from moisture and/or dirt.

Additional design challenges may include the different implementations of the RRU in a dual-band (e.g., two different frequencies), tri-band (e.g., three different frequencies), and Multiple-Input and Multiple-Output ("MIMO") RRU configurations that may drive additional PAM modules and increase computational complexity and power supply sizing. These additional considerations may increase (e.g., linearly increase) the thermal envelope of the RRU. Network operators who maintain these RRUs may desire a lightweight, low-volume passive thermal solution. Original Equipment Manufacturers ("OEM") may therefore rely on passive techniques to cool down the RRUs using, for example, heat spreaders, thermal interface materials and/or vapor chambers, and die-cast aluminum fins.

The present disclosure is generally directed to a novel mechanical solution for an RRU design that may improve the thermal performance of the RRU while maximizing the use of the fins and reducing the volume of the RRU unit. As will be explained in greater detail below, a thermal management component may establish a thermal path with an RF component. An RF filter may be electrically coupled to the RF component and arranged away from the thermal path. This design may advantageously improve thermal performance, for instance by reducing components in the thermal path, and further, more efficiently utilize volume for arranging components, for instance by arranging the RF filter near an exterior of the RRU chassis, and further provide modularity, for instance by allowing the RF filter to be removable without having to open the RRU chassis and without having to disconnect other RF components within the RRU chassis.

In addition, the present disclosure provides a modular architecture, as compared to other RRU architectures. For example, many RRUs may require rebanding (e.g., changing of its frequency of operation), which may require rebuilding the RRU with different components and in some cases a redesign of the RRU. The modular architecture described herein may further allow swapping components (e.g., filters, PAMs, duplexers, etc.) with other elements without requiring major rebuilding and/or redesigning of the modular RRU, which may further reduce time to market as well as reduce development costs for rebanding the product for multiple mobile network operators ("MNO").

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-4D, detailed descriptions of an improved design for RRUs and/or similar devices. Detailed descriptions of an RRU are provided with FIG. 1. Detailed descriptions of an example design for an RRU are provided with FIG. 2. Further description of an example design, including internal arrangements, are provided with FIG. 3. FIGS. 4A-D present various views of additional embodiments.

Figure 1:
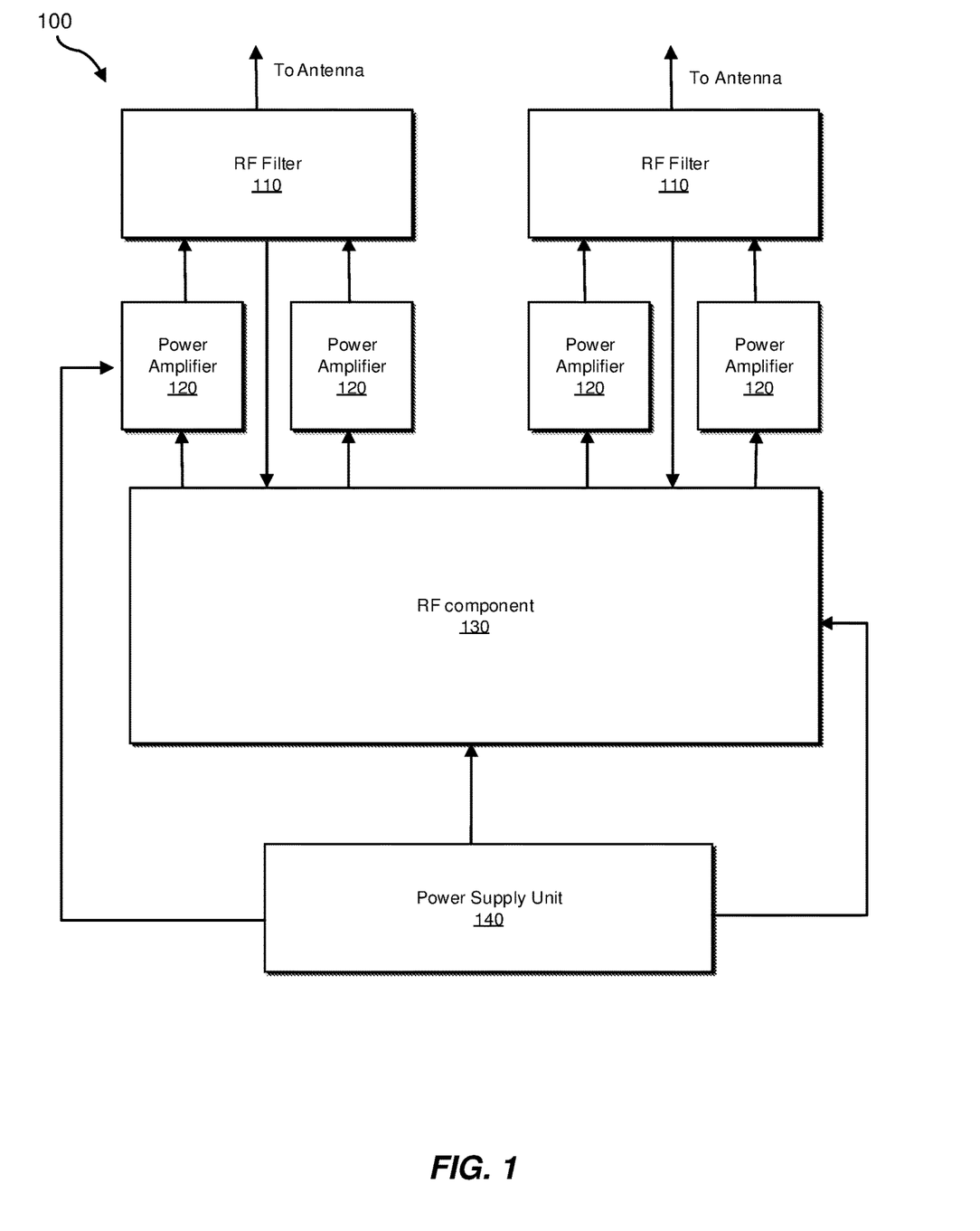
FIG. 1 is a block diagram showing components of an exemplary remote radio unit.

FIG. 1 illustrates exemplary components of an RRU. FIG. 1 shows an RRU 100 that may include one or more RF filters 110, power amplifiers ("PA") 120, RF component 130, and a power supply unit ("PSU") 140. RF filter 110 may correspond to any component and/or circuit that may block undesired RF signals and allow desired RF signals and may include, for example, a duplexer, a diplexer, a triplexer, a quadplexer, and/or other discrete filters. As illustrated in FIG. 1, RF filter 110 may be coupled to an antenna for outputting signals.

RF component 130 may correspond to any electrical component and/or circuit in RRU 100. Although not illustrated in FIG. 1, RF component 130 may include various components, for example one or more processors, FPGAs, ASICs, and/or other RF components such as low power RF components. In addition, RF component 130 may include and/or otherwise be a part of one or more RF circuits.

Certain components, such as RF component 130 and/or PA 120, may generate more heat than other components, such as RF filter 110, or may otherwise have a higher priority in thermal management. Although improving thermal efficiency as well as reducing the weight and volume of an RRU are desirable, mechanical design considerations and electronic packaging architectures may need to be considered for such improvements. The mechanical design disclosed herein provides the aforementioned improvements that considers mechanical and architectural constraints by arranging certain components, (e.g., components that may not be as heat generative as other components in the RRU) out of a thermal path between components and thermal management components (which may be passive, such as a heat sink). For example, RF filters (e.g., duplexers) may be placed on the sides of the RRU for increasing the number of available heat sinking surfaces (e.g., of the thermal management component) to provide a more direct thermal path between heat generating components and the mechanical enclosure fins of the thermal management component.

Figure 2:
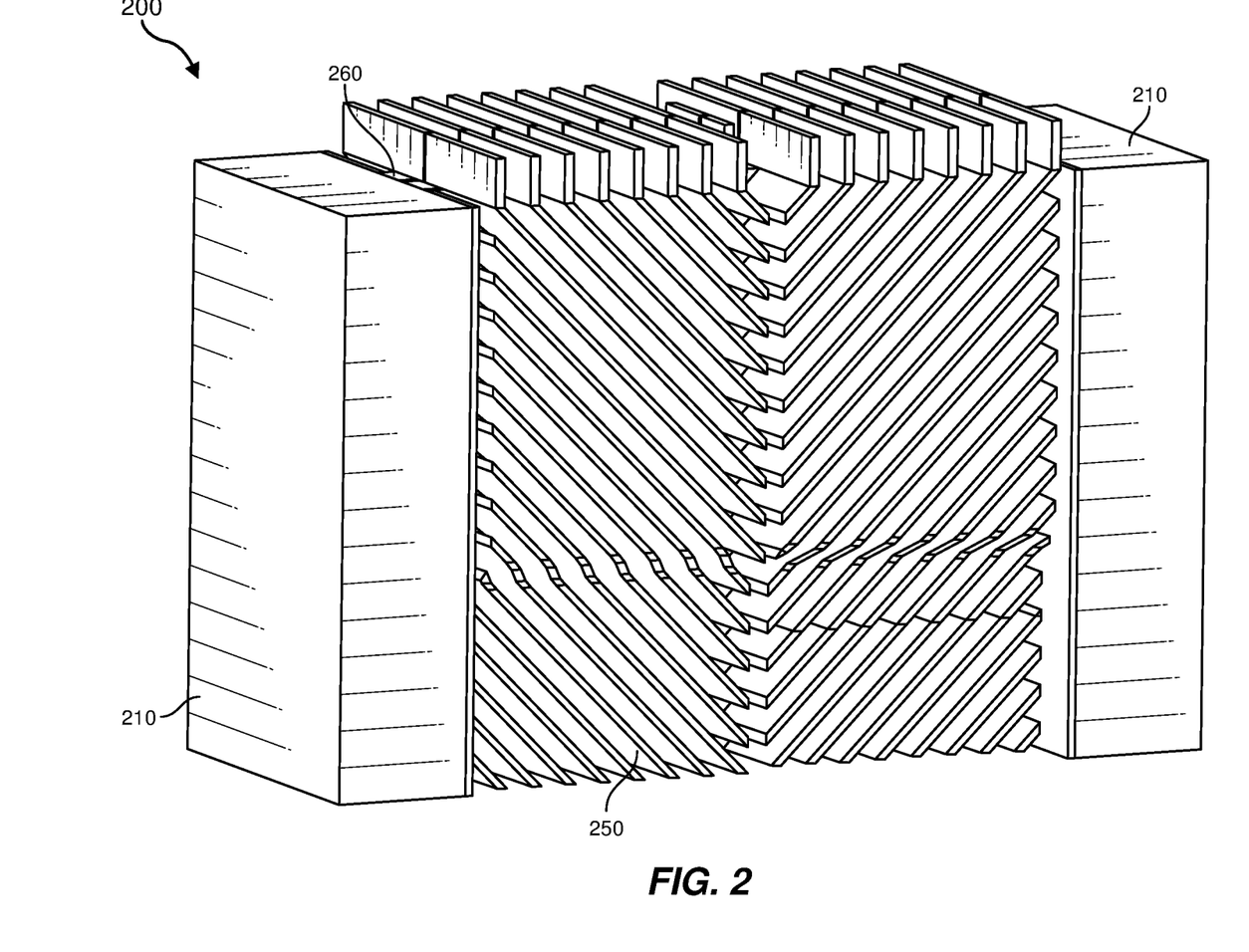
FIG. 2 is an illustration showing an external view of an exemplary remote radio unit.

FIG. 2 illustrates an external view of an RRU 200 that may correspond to an embodiment of an RRU design as described herein. As illustrated in FIG. 2, RRU 200 may include a chassis 260, a thermal management component 250, and an RF filter 210. Chassis 260 may house components of RRU 200 (which may include components as illustrated in FIG. 1), and may be made of a suitable rigid material. Thermal management component 250 may be a passive thermal management component such as a heat sink, although in other embodiments may comprise any suitable thermal management system. In some embodiments, such as illustrated in FIG. 2, thermal management component 250 may be attached to or otherwise integrated with chassis 260.

As illustrated in FIG. 2, RF filter 210 may be located to the sides of RRU 200 and may otherwise not be located between internal components of RRU 200 and thermal management component 250. By arranging RF filter 210 outside of or away from (e.g., lateral to) a direct thermal path for thermal management component 250 (e.g., the thermal path between the internal components of RRU 200 and thermal management component 250), thermal management component 250 may be able to provide more efficient heat dissipation to the internal components of RRU 200. In addition, RF filter 210 may be removable from RRU 200. For instance, RF filter 210 may be removed from chassis 260 without having to open or otherwise disassemble chassis 260. Although in FIG. 2 RRU 200 may include two RF filters 210 (e.g., a dual-band configuration), in other embodiments, RRU 200 may include a single RF filter 210 (e.g., a single-band configuration).

Figure 3:
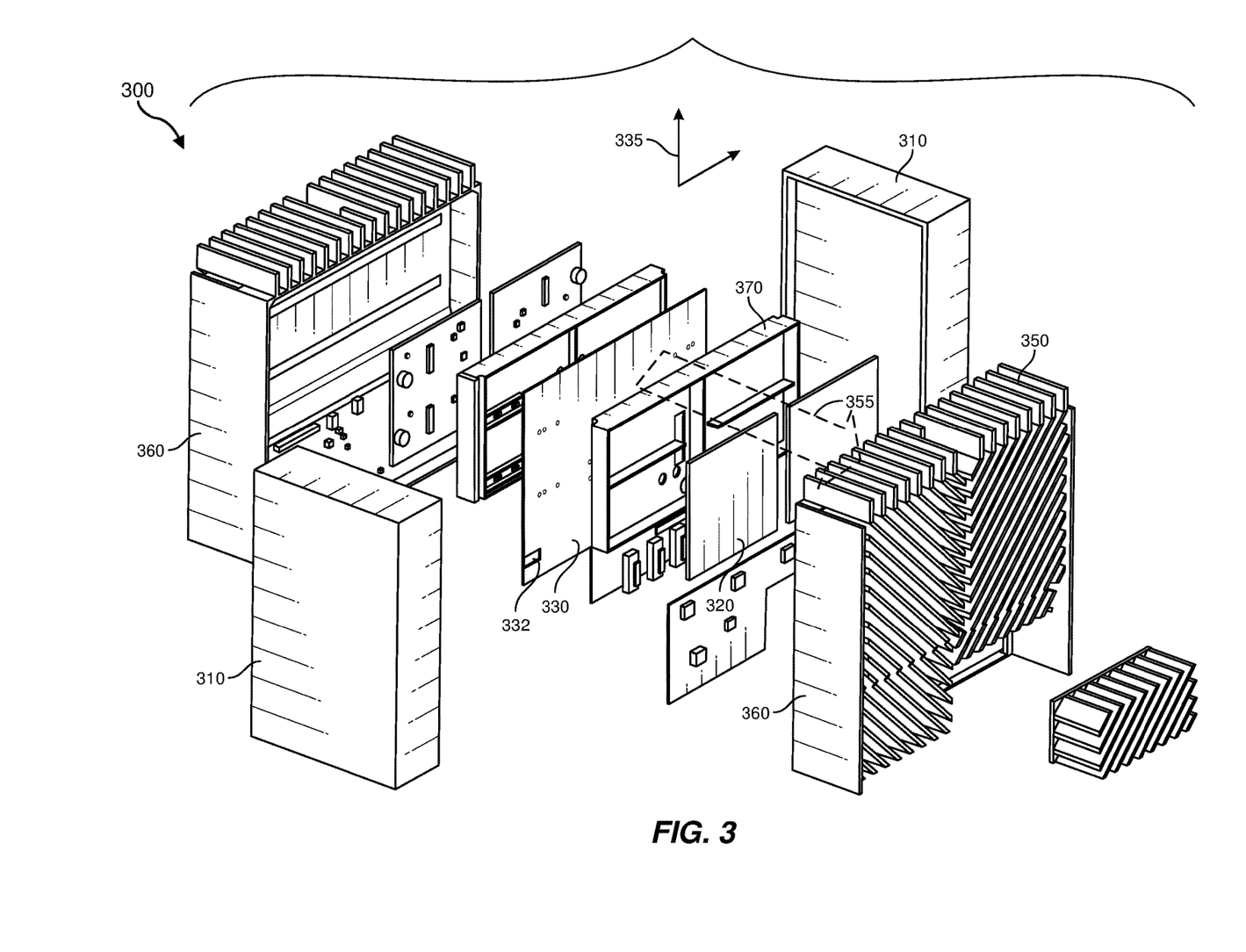
FIG. 3 is an exploded view of an exemplary remote radio unit.

FIG. 3 presents another embodiment of an RRU design. FIG. 3 illustrates an exploded view of an RRU 300, which may correspond to RRU 200 and may have a similar layout as RRU 200. RRU 300 may include an RF filter 310, a PA 320, an RF component 330, an interconnect 332, a thermal management component 350, a chassis 360, and a shield component 370. FIG. 3 further illustrates a reference plane 335 and a thermal path 355. RF filter 310 may correspond to RF filter 110 and may comprise, for example, a duplexer or other signal filtering device that may be housed in its own chassis separate from chassis 360. PA 320 may correspond to PA 120. RF component 330 may correspond to RF component 130 and may further comprise additional components illustrated in FIG. 3.

The RRU design described herein may more efficiently utilize passive thermal management. As seen in FIG. 3, the arrangement of RF filter 310 may allow for a more direct thermal path 355 between various components of RRU 300 (e.g., RF component 330 and/or PA 320) and thermal management component 350. In other words, RF filter 310 may not significantly impede the thermal management provided by thermal management component 350.

In addition, this RRU design may more efficiently utilize surface area available for heat dissipation. Reference plane 335 may correspond to a planar surface of RF component 330. As illustrated in FIG. 3, thermal management component 350 may be parallel to reference plane 335 (e.g., having a major planar surface parallel to the planar surface of RF component 330, and having fins extending therefrom). Because RF filter 310 is not located between RF component 330 and thermal management component 350, additional surface area of thermal management component 350 may be in thermal path 355 such that the additional surface area may be utilized for heat dissipation. The increased surface area of thermal management component 350 may include covering an increased area of chassis 360, allowing for additional fins that may increase fin surface area for heat dissipation.

RRU 300 further includes shield component 370 to provide electromagnetic shielding for RF component 330 and PA 320. Because RF filter 310 is not located between RF component 330 and PA 320, shield component 370 may be used to shield components on either side of shield component 370, rather than requiring individual shield components for each of RF component 330 and PA 320. Shield component 370 may not generate heat and in some embodiments may conduct heat such that shield component 370 may not impede thermal path 355.

As described herein, RF filter 310 may be away from thermal path 355. In FIG. 3, RF filter 310 may be arranged perpendicular to the planar surface of RF component 330 (e.g., a planar surface of RF filter 310 may be perpendicular to reference plane 335). As further illustrated in FIG. 3, RF filter 310 may therefore be positioned generally near the exterior of chassis 360. This arrangement may facilitate removal of RF filter 310 from RRU 300 such that RRU 300 may be modular. For example, RRU 300 may be re-banded by swapping RF filter 310 for a different RF filter 310 corresponding to a desired RF frequency range. Chassis 360 may include mounting locations for RF filter 310.

To further facilitate modularity and removability of RF filter 310, RRU 300 may include at least one interconnect 332 for coupling RF filter 310 to RF component 330. Interconnect 332, along with the mounting location, may provide a single interface for connecting and/or removing RF filter 310. Interconnect 332 may allow direct coupling between RF component 330 and RF filter 310 without requiring an interface card, such as a riser card. In some embodiments, interconnect 332 may be a vertical connector that may be oriented perpendicular to reference plane 335 (e.g., 90 degrees from the planar surface of RF component 330).

Figure 4A:
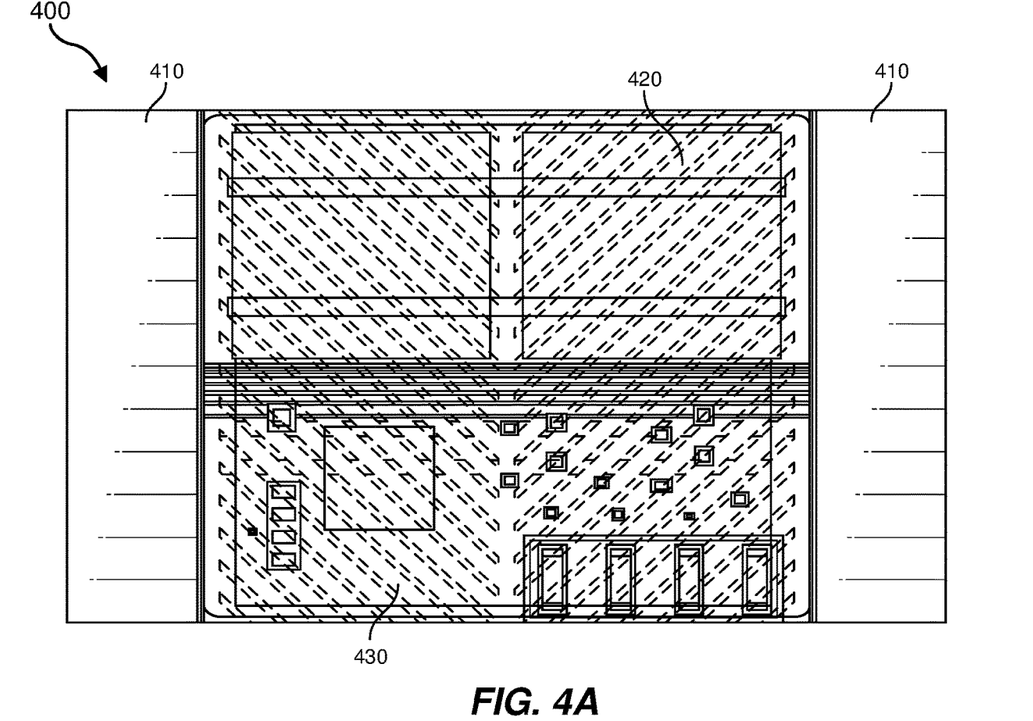
FIGS. 4A-D are various views of an exemplary remote radio unit.
Figure 4B:
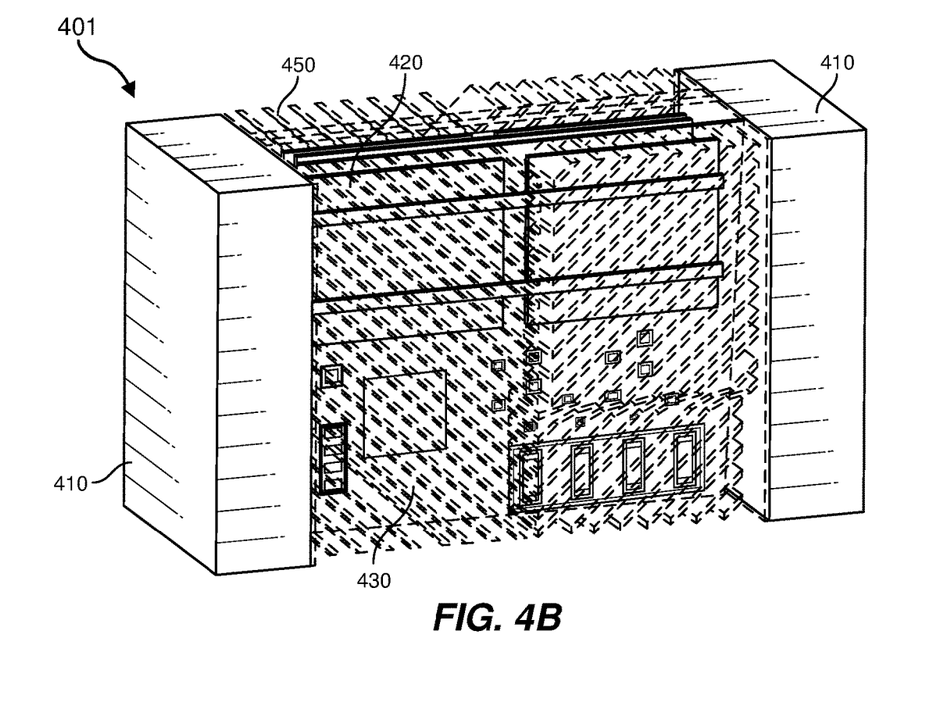
Figure 4C:
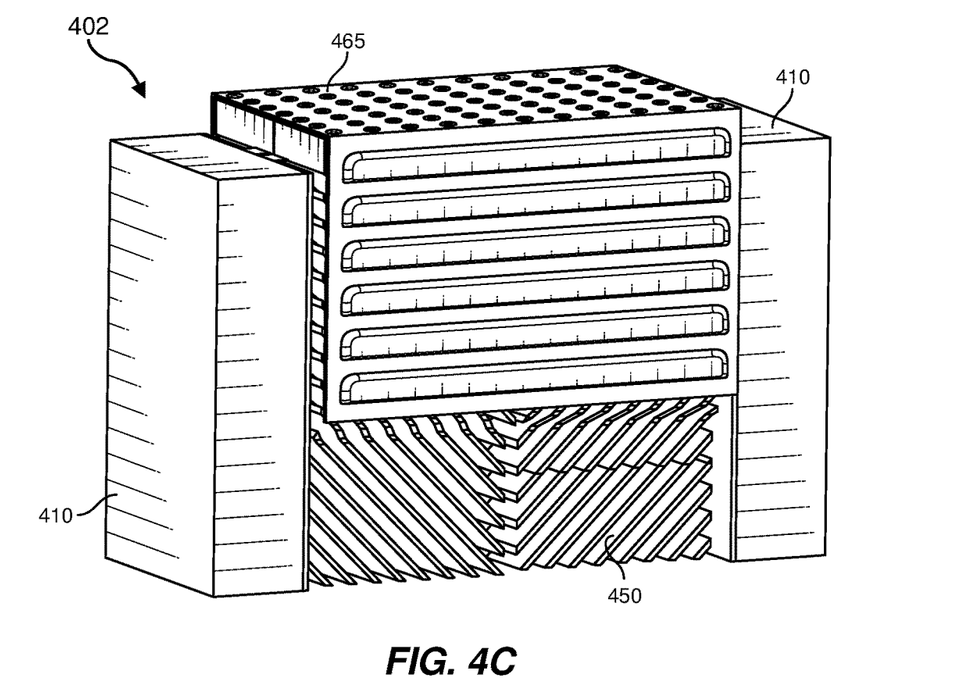
Figure 4D:
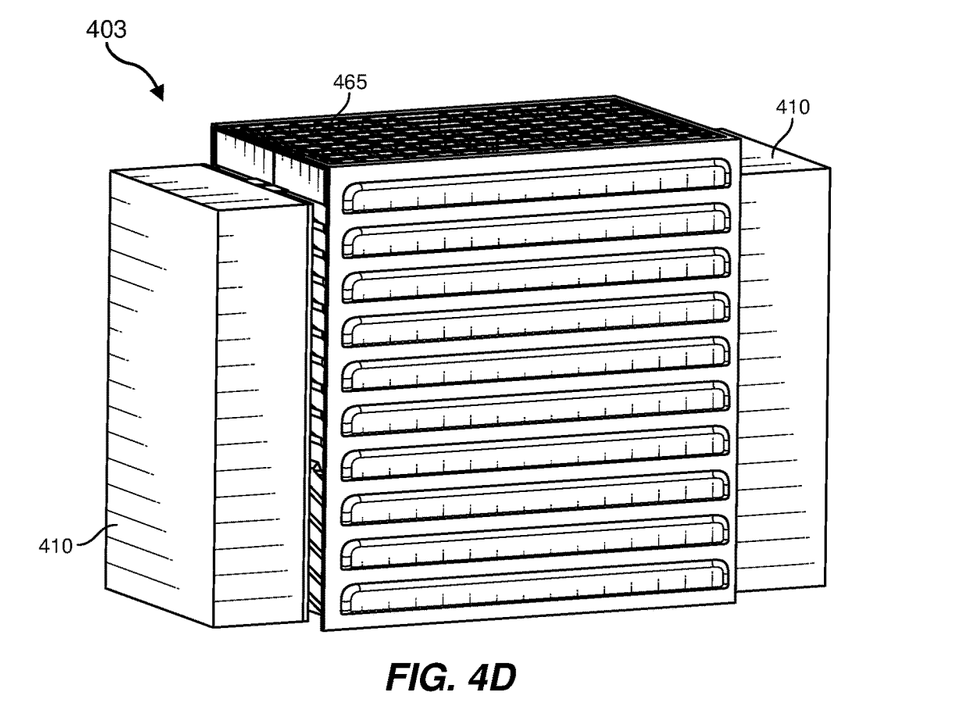

FIGS. 4A-D illustrate various views of RRUs as described herein, including an RRU 400, an RRU 401, an RRU 402, and an RRU 403, which may each correspond to RRU 300. As illustrated in FIGS. 4A and 4B, RF filter 410 may be located laterally to reduce components between RF component 430, PA 420, and thermal management component 450. Other embodiments may include, for example, a cover 465 as illustrated in FIGS. 4C and 4D.

Although the present disclosure describes arranging an RF filter away from the thermal path and near a chassis exterior, in other embodiments other components may be arranged as such to facilitate modular components. In addition, the modular components may include a chassis designed as needed, for instance having a heatsink or other chassis features.

As described herein, a modular RRU may include a removable component, such as an RF filter. The modular RRU may be designed and manufactured without being limited to a particular RF filter such that the modular RRU may be re-banded to a different RF band by swapping the RF filter. In addition, by placing the RF filter externally rather than sandwiched between RF components, heat generated by the RF components may more effectively be managed via passive thermal management. Thus, the modular RRU may exhibit improved thermal performance while meeting volume and other design considerations.

EXAMPLE EMBODIMENTS

Example 1: A device comprising: a radio frequency (RF) component; a thermal management component establishing a thermal path with the RF component; an RF filter electrically coupled to the RF component and arranged away from the thermal path; and a chassis for housing the RF component, wherein the thermal management component and the RF filter are positioned near an exterior of the chassis.

Example 2: The device of Example 1, wherein the RF filter is removable from the chassis.

Example 3: The device of Example 1 or 2, wherein the RF component comprises a planar surface and the RF filter is oriented perpendicular to the planar surface.

Example 4: The device of Example 3, further comprising an interconnect for coupling the RF component to the perpendicularly oriented RF filter.

Example 5: The device of Example 3 or 4, wherein the interconnect comprises one or more vertical connectors extending along the planar surface.

Example 6: The device of Example 3, 4, or 5, wherein the interconnect allows direct coupling between the RF component and the RF filter.

Example 7: The device of any of Examples 3-6, wherein the thermal management component is arranged parallel to the planar surface.

Example 8: The device of any of Examples 1-7, further comprising a power amplifier electrically coupled to the RF component and the RF filter.

Example 9: The device of Example 8, further comprising a shield component arranged between the RF component and the power amplifier.

Example 10: The device of any of Examples 1-9, wherein the thermal management component comprises a passive thermal management component.

Example 11: The device of any of Examples 1-10, wherein the RF filter comprises a duplexer.

Example 12: An apparatus comprising: a radio frequency (RF) device comprising: an RF component; a thermal management component establishing a thermal path with the RF component; and a chassis for housing the RF component, wherein the thermal management component and the RF filter are positioned near an exterior of the chassis; and an RF filter electrically coupled to the RF component, arranged away from the thermal path, and mounted near an exterior of the chassis.

Example 13: The apparatus of Example 12, wherein the RF filter is removable from the chassis.

Example 14: The apparatus of Example 12 or 13, wherein the RF component comprises a planar surface and the RF filter is oriented perpendicular to the planar surface.

Example 15: The apparatus of Example 14, further comprising an interconnect for coupling the RF component to the perpendicularly oriented RF filter, wherein the interconnect comprises one or more vertical connectors extending along the planar surface and the interconnect allows direct coupling between the RF component and the RF filter.

Example 16: The apparatus of Example 14 or 15, wherein the thermal management component is arranged parallel to the planar surface.

Example 17: The apparatus of any of Examples 12-16, further comprising: a power amplifier electrically coupled to the RF component and the RF filter; and a shield component arranged between the RF component and the power amplifier.

Example 18: A system comprising: an antenna; a remote radio unit (RRU) coupled to the antenna and comprising: a radio frequency (RF) component; a thermal management component establishing a thermal path with the RF component; and a chassis for housing the RF component, wherein the thermal management component is positioned near an exterior of the chassis; and an RF filter electrically coupled to the RF component, arranged away from the thermal path, and mounted near an exterior of the chassis.

Example 19: The system of Example 18, wherein the RF filter is removable from the chassis.

Example 20: The system of Example 18 or 19, wherein: the RF component comprises a planar surface; the RF filter is oriented perpendicular to the planar surface; the RRU further comprises an interconnect for coupling the RF component to the perpendicularly oriented RF filter; the interconnect comprises one or more vertical connectors extending along the planar surface; and the interconnect allows direct coupling between the RF component and the RF filter.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
a radio frequency (RF) component comprising a planar surface;
a thermal management component establishing a thermal path with the RF component and arranged parallel to the planar surface;
an RF filter electrically coupled to the RF component and arranged away from the thermal path and is oriented perpendicular to the planar surface; and
a chassis for housing the RF component, wherein the thermal management component and the RF filter are positioned near an exterior of the chassis.

2. The device of claim 1, wherein the RF filter is removable from the chassis.

3. The device of claim 1, further comprising an interconnect for coupling the RF component to the perpendicularly oriented RF filter.

4. The device of claim 3, wherein the interconnect comprises one or more vertical connectors extending along the planar surface.

5. The device of claim 3, wherein the interconnect allows direct coupling between the RF component and the RF filter.

6. The device of claim 1, further comprising a power amplifier electrically coupled to the RF component and the RF filter.

7. The device of claim 6, further comprising a shield component arranged between the RF component and the power amplifier.

8. The device of claim 1, wherein the thermal management component comprises a passive thermal management component.

9. The device of claim 1, wherein the RF filter comprises a duplexer.

10. The device of claim 1, further comprising a cover at least partially covering the chassis and the thermal management component.

11. The device of claim 1, further comprising a cover covering the thermal management component.

12. An apparatus comprising:
a radio frequency (RF) device comprising:
an RF component comprising a planar surface;
a thermal management component establishing a thermal path with the RF component and arranged parallel to the planar surface; and
a chassis for housing the RF component, wherein the thermal management component is positioned near an exterior of the chassis; and
an RF filter electrically coupled to the RF component, arranged away from the thermal path, oriented perpendicular to the planar surface, and mounted near an exterior of the chassis.

13. The apparatus of claim 12, wherein the RF filter is removable from the chassis.

14. The apparatus of claim 12, further comprising an interconnect for coupling the RF component to the perpendicularly oriented RF filter, wherein the interconnect comprises one or more vertical connectors extending along the planar surface and the interconnect allows direct coupling between the RF component and the RF filter.

15. The apparatus of claim 12, further comprising:
a power amplifier electrically coupled to the RF component and the RF filter; and
a shield component arranged between the RF component and the power amplifier.

16. The apparatus of claim 12, further comprising a cover at least partially covering the chassis and the thermal management component.

17. A system comprising:
an antenna;
a remote radio unit (RRU) coupled to the antenna and comprising:
a radio frequency (RF) component comprising a planar surface;
a thermal management component establishing a thermal path with the RF component and arranged parallel to the planar surface; and
a chassis for housing the RF component, wherein the thermal management component is positioned near an exterior of the chassis; and
an RF filter electrically coupled to the RF component, arranged away from the thermal path, oriented perpendicular to the planar surface, and mounted near an exterior of the chassis.

18. The system of claim 17, wherein the RF filter is removable from the chassis.

19. The system of claim 17, wherein:
the RRU further comprises an interconnect for coupling the RF component to the perpendicularly oriented RF filter;
the interconnect comprises one or more vertical connectors extending along the planar surface; and
the interconnect allows direct coupling between the RF component and the RF filter.

20. The system of claim 17, further comprising a cover at least partially covering the chassis and the thermal management component.

* * * * *